United States Patent
Joshi et al.

(10) Patent No.: US 10,139,446 B2
(45) Date of Patent: Nov. 27, 2018

(54) MASSIVE MULTI-DIMENSIONALITY FAILURE ANALYTICS WITH SMART CONVERGED BOUNDS

(71) Applicant: International Business Machines Corporation, Armonk, NY (US)

(72) Inventors: Rajiv Vasant Joshi, Yorktown Heights, NY (US); Emrah Acar, Montvale, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 517 days.

(21) Appl. No.: 14/839,740

(22) Filed: Aug. 28, 2015

(65) Prior Publication Data
US 2017/0059649 A1   Mar. 2, 2017

(51) Int. Cl.
G01R 31/28    (2006.01)
G06F 17/50    (2006.01)
G11C 29/56    (2006.01)

(52) U.S. Cl.
CPC ......... *G01R 31/2894* (2013.01); *G06F 17/50* (2013.01); *G11C 29/56008* (2013.01)

(58) Field of Classification Search
CPC . G06F 2217/10; G06F 17/18; G01R 31/2894; G11C 29/08; G11C 29/56008; G06K 9/6226; G06K 9/6277
See application file for complete search history.

(56) References Cited

U.S. PATENT DOCUMENTS

| 5,608,659 A * | 3/1997 | Lin ................. G06F 17/18 702/181 |
| 9,451,611 B2 * | 9/2016 | Cai ................. H04W 72/0433 |
| 2003/0004679 A1 | 1/2003 | Tryon, III et al. |
| 2007/0076669 A1 * | 4/2007 | Boroujeny ............ H03M 13/47 370/335 |

(Continued)

FOREIGN PATENT DOCUMENTS

| EP | 1 352 327 A2 | 10/2003 |
| FR | 3 006 470 A1 | 12/2014 |

(Continued)

OTHER PUBLICATIONS

Mukhopadhyay, Saibal, et al; "Modeling of failure probability and statistical design of SRAM array for yield enhancement in nanoscaled CMOS." Computer-Aided Design of Integrated Circuits and Systems, IEEE Transactions on 24, No. 12 (2005): 1859-1880.

(Continued)

*Primary Examiner* — Elias Desta
(74) *Attorney, Agent, or Firm* — Rabin Bhattacharya, Esq.; McGinn IP Law Group, PLLC (57) ABSTRACT

A method and a system including a processor performing a failure region exploration through uniform sampling of plurality of variables related to a circuit, the processor shifting probability distributions to explore failure probability, the processor estimating the failure probability and standard deviation by determining mean and standard deviation of failure probability of a circuit, the processor terminating sampling when a confidence interval bounds converge, and a peripheral device providing a report on the failure of the circuit when the sampling is terminated by the processor.

20 Claims, 8 Drawing Sheets

(56) References Cited

U.S. PATENT DOCUMENTS

| | | |
|---|---|---|
| 2008/0004841 A1 | 1/2008 | Nakamura et al. |
| 2008/0015827 A1 | 1/2008 | Tryon, III et al. |
| 2008/0141072 A1 | 6/2008 | Kalgren et al. |
| 2009/0248370 A1* | 10/2009 | Rutenbar ............ G06F 17/5036 703/2 |
| 2011/0022900 A1 | 1/2011 | Kakadia et al. |

FOREIGN PATENT DOCUMENTS

| | | |
|---|---|---|
| WO | WO 02/054654 | 7/2002 |
| WO | WO 2008/074864 A1 | 6/2008 |

OTHER PUBLICATIONS

Dogan, Atakan, et al; "Matching and scheduling algorithms for minimizing execution time and failure probability of applications in heterogeneous computing." Parallel and Distributed Systems, IEEE Transactions on 13, No. 3 (2002): 308-323.

\* cited by examiner

MASSIVE MULTI-DIMENSIONALITY FAILURE ANALYTICS WITH SMART CONVERGED BOUNDS

This invention was made with Government support under Contract No.: HR0011-13-C-0022 awarded by Defense Advanced Research Projects Agency (DARPA). The Government has certain rights in this invention.

BACKGROUND OF THE INVENTION

Field of the Invention

The disclosed invention relates generally to failure analysis, and more particularly, but not by way of limitation, relating to a massive multi-dimensional failure analysis of a circuit.

Description of the Related Art

An important part of manufacturing and troubleshooting a circuit is locating and correcting a malfunctioning circuit or area of a circuit. Such failure analysis is important for reliability of a circuit, but can be very time consuming and expensive. Fault analysis of highly-integrated semiconductor circuits has become an important tool in the optimization of product quality.

Advanced warning of a system or component failure is desirable, including competitiveness through lower cost with higher reliability and minimized downtime. Such failures may present safety or maintenance concerns that could result in loss of market share an increased costs in the future.

As memory array architectures increase requirements for density and speed, accurately estimating the cell failure rate of a design becomes critical. For example, a finite number of redundant rows and/or columns is available to replace those containing defective cells, a number of failed cells above this level of redundancy will yield a defective device. The number of defective devices, or device yield is then directly related to the cell failure rate. Additionally, the larger arrays have increasingly stringent failure rate control requirements.

The Monte-Carlo analysis of the defective cells requires a very large number of iterations, due to the random sampling of the entire probability space of the independent variables that are treated in the analysis. For example, The failure rate Pf can be estimated by a brute-force Monte Carlo analysis. When a brute-force Monte Carlo analysis is applied to estimate the failure rate Pf that is extremely small (e.g., $10^{-8} \sim 10^{-6}$), most random samples drawn from the PDF f(x) do not fall into the failure region $\Omega$. Hence, a large number of (e.g., $10^7 \sim 10^9$) samples are needed to accurately estimate the failure rate Pf.

As the cell failure rate decreases, the number of samples and iterations required for accurate analysis becomes increasingly large, because of the relatively sparse distribution of samples in the distribution that correspond to failed cells. The effect of circuit changes on cell read and write-ability, as well as minimum read and write cycle times and margins are difficult to estimate at very low failure rate levels, so such low failure rates cause further complications for adjusting designs to achieve the best result.

Techniques other than Monte-Carlo analysis have been implemented for estimating cell failure rates, each with related drawbacks. Sensitivity analysis is a well-known technique in which the gradients of the various independent variables are used to determine the bounds of the non-failure confidence region. However, accurate estimates of the failure rate are not typically produced by sensitivity analysis, as sensitivity analysis by its very nature cannot determine the exact overlapping impact of all independent variables on the cell failure rate at once. Another technique that can accurately estimate the failure rate is the grid analysis approach, in which the grid size can be made arbitrarily small. However, the number of simulations increases exponentially with the number of independent variables and typically a large amount of custom coded program control (scripting) must be employed to direct the analysis.

Accurately estimating the rare failure rates for nanoscale circuit blocks (e.g., SRAM (Static Random Access Memory), DFF, etc.) is an even more challenging task, especially when the variation space is high-dimensional. The random variations in process parameters have emerged as a major design challenge in circuit design in the nanometer scale. For example, in an SRAM cell, a mismatch in the strength between the neighboring transistors, caused by intra-die variations, can result in the failure of the cell.

The failure analysis in the single-dimensional failure analysis techniques is limited and time consuming.

Therefore, the state of the art solution for statistical circuit analysis and yield analysis does not scale well for higher number of dimensions and variation sources.

Therefore, it is desirable to provide a failure analysis of a circuit that cost effective and efficient.

It is also desirable to have an effective analysis of yield and reliability for devices and circuits using advanced statistical analysis techniques with many parametric variables at higher dimensions.

SUMMARY OF INVENTION

In view of the foregoing and other problems, disadvantages, and drawbacks of the aforementioned background art, an exemplary aspect of the disclosed invention provides a system and method of failure analysis or simulation.

One aspect of the present invention provides a computer system executing a method stored in a computer readable medium, including processor performing a failure region exploration through uniform sampling of plurality of variables related to a circuit, the processor shifting probability distributions to explore failure probability, the processor estimating the failure probability and standard deviation by determining mean and standard deviation of failure probability of a circuit, the processor terminating sampling when a confidence interval bounds converge, and a peripheral device providing a report on the failure of the circuit when the sampling is terminated by the processor.

The confidence interval bounds include an upper bound sigma estimate, a lower bound sigma estimate, and sigma estimate, and the processor stops sampling when the upper bound sigma estimate, the lower bound sigma estimate, and the sigma estimate substantially converge. The processor stops sampling when the upper bound sigma estimate, the lower bound sigma estimate, and the sigma estimate converge by a predetermined threshold and before divergence of the upper bound sigma estimate, the lower bound sigma estimate, and the sigma estimate. The confidence interval bounds include an upper bound sigma estimate, a lower bound sigma estimate, and sigma estimate, and the processor stops sampling when the upper bound sigma estimate, the lower bound sigma estimate, and the sigma estimate substantially converge by a predetermined threshold. The variance of the probability of the failure is calculated based on the sample weights of an applied mixed importance sampling. The probability of failure and the statistical variance are evaluated incrementally for each variable. The processor prunes the number of variables through with known statistical variations based on the probability of failure and statistical variance calculated within a simulation of the circuit.

Another example aspect of the disclosed invention is to provide a system for computing and modeling the probability of a failure of a circuit, including a processor measuring a system functionality by an indicator function based on one or more output variables and pre-given thresholds stored in a computer readable medium, the processor simulating a system behavior for a sequence of samples of random model parameters, the processor determining the probability of failure and the statistical variance of that are being evaluated at each sampling stage, and the processor terminating a sequence of the simulations when the said statistical variance is below a certain target, and a rate of change of the variance is below a threshold designed as a stopping criterion.

The system exhibits inherent variability with a multitude of model parameters under prescribed statistical variability. The termination of the sequence of simulation when convergence is made between an upper bound, lower bound and a sigma estimate. The processor prunes key variables which would be used input for the plurality of simulations. The processor determines an upper bound sigma estimate, a lower bound sigma estimate, and sigma estimate, and the processor stops sampling when the upper bound sigma estimate, the lower bound sigma estimate, and the sigma estimate substantially converge by the predetermined threshold. The processor stops sampling when the upper bound sigma estimate, the lower bound sigma estimate, and the sigma estimate converge by a predetermined threshold and before divergence of the upper bound sigma estimate, the lower bound sigma estimate, and the sigma estimate. The variance of the probability of the failure is calculated based on the sample weights of an applied mixed importance sampling. The probability of failure and the statistical variance are evaluated incrementally for each variable. The processor prunes the number of variables through with known statistical variations based on the probability of failure and statistical variance calculated within the simulations of the circuit.

Yet another example aspect of the disclosed invention is to provide a method computing and modeling the probability of a failure of a device, the method including performing a failure region exploration through uniform sampling of a plurality of variables related to the device, shifting probability distributions to explore failure probability, estimating the failure probability and standard deviation by determining mean and standard deviation of failure probability of a device, terminating sampling when a confidence interval bounds converge, and providing a report on the failure of the circuit when the sampling is terminated.

The confidence interval bounds include an upper bound sigma estimate, a lower bound sigma estimate, and sigma estimate, and a processor stops sampling when the upper bound sigma estimate, the lower bound sigma estimate, and the sigma estimate substantially converge. The processor stops sampling when the upper bound sigma estimate, the lower bound sigma estimate, and the sigma estimate converge by a predetermined threshold and before divergence of the upper bound sigma estimate, the lower bound sigma estimate, and the sigma estimate. The confidence interval bounds include an upper bound sigma estimate, a lower bound sigma estimate, and sigma estimate, and the processor stops sampling when the upper bound sigma estimate, the lower bound sigma estimate, and the sigma estimate substantially converge by a predetermined threshold.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF DRAWINGS

The exemplary aspects of the invention will be better understood from the following detailed description of the exemplary embodiments of the invention with reference to the drawings.

DETAILED DESCRIPTION OF A PREFERRED EMBODIMENTS

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

The disclosed invention employs an accurate yet computationally efficient scalable statistical analysis methodology at its best to deal with higher dimensional variations. Nanoscale SRAM cells, latches, and other highly critical circuit blocks that require high amounts of reliability is taking advantage of the disclosed invention. There is a need for smart, efficient algorithm to choose the right sampling size and important samples to perform efficient failure analytics at pre-specified error tolerances. The disclosed invention formulates an effective monitoring of failure probability estimate and its confidence interval bounds to determine the convergence of the statistical analysis. Range-bound convergence determination would solve the sampling size problem.

Statistical techniques are crucial for circuit analysis/verification for sub-nanometer technologies, especially for failure analytics. Current failure analytics (i.e. yield prediction) for higher dimensional problems use black-box modeling such as regression techniques. However, the required number of samples are huge and the regression models sacrifice accuracy and don't extend to generality. For example, beyond 6 parameters, 1 ppm (parts per million) circuit failure probability requires millions of Monte Carlo points in the Monte Carlo method, which is a class of numerical method that relies on random sampling. As shown earlier, the Monte Carlo simulation is a way of approximating a value of a function where calculating the actual value is difficult.

Mixed Important Sampling Technique exists yet still require significant compute runtime and large number of samples with high dimensional variability. In order to achieve an accuracy of 0.1%, millions of samples are required. Therefore, the current multidimensional approaches require a high degree of computation that require expensive hardware and time.

The disclosed invention concerns techniques for overcoming the limitations of traditional Monte-Carlo analysis and other known techniques for circuits where the failure rate of the circuit being analyzed is very low. In particular, with respect to circuits having large arrays of identical cells, the cells are generally the determining factor in the failure rate, but only as a totality of the cells. Since millions of cells may be incorporated in a memory array, even very low failure rates contribute significantly to the failure rate of the individual memory devices or other devices that incorporate memory such arrays.

Therefore, it is necessary to analyze the cell design and process variations at the extreme end of the distribution of actual cell parameters in order to gain meaningful information that can accurately predict device yields and permit improvement of the cells in order to improve device yields. The techniques presently used either require exhaustive computation and storage, or do not perform well once there are more than a small number of variable design and process parameters, such as device areas or lengths and widths, doping densities, threshold voltages and other measures of design and process parameters. The disclosed invention provides a mechanism in a manner that effectively models memory cells and other circuits and can be applied to many other possible applications where reducing failure rate is a criterion.

For instance, the failure rate of an SRAM bit-cell must be very low, for example less than $10^{-8}$ so that a microprocessor system, which may include millions of SRAM bit-cells, can achieve sufficiently high yield.

Combining the benefits of mixed uniform sampling to generate the explore the circuit failures under parametric variations and then apply focused importance sampling for accurate and efficient analysis of yield calculation.

The method requires significantly fewer samples than plain Monte-Carlo analysis, and is efficient more than 100-1000×. The required sample sizes for accurate yield modeling increases with the number of variational parameters. The disclosed invention provides how can one detect that efficiently and accurately for all general high dimensional problems.

One example feature is the development of formulas for mean yield estimate and a confidence interval for the yields with sufficient tolerances. One can monitor the evolution of the mean estimates as well as the evolution of the confidence intervals to make convergence decisions.

A new algorithm can be effectively used for predictive analytics and forms an new arena in regression methodology. Therefore, the disclosed invention can be effectively used for determining the sample sizes for accurate failure analytics.

Figure 5:
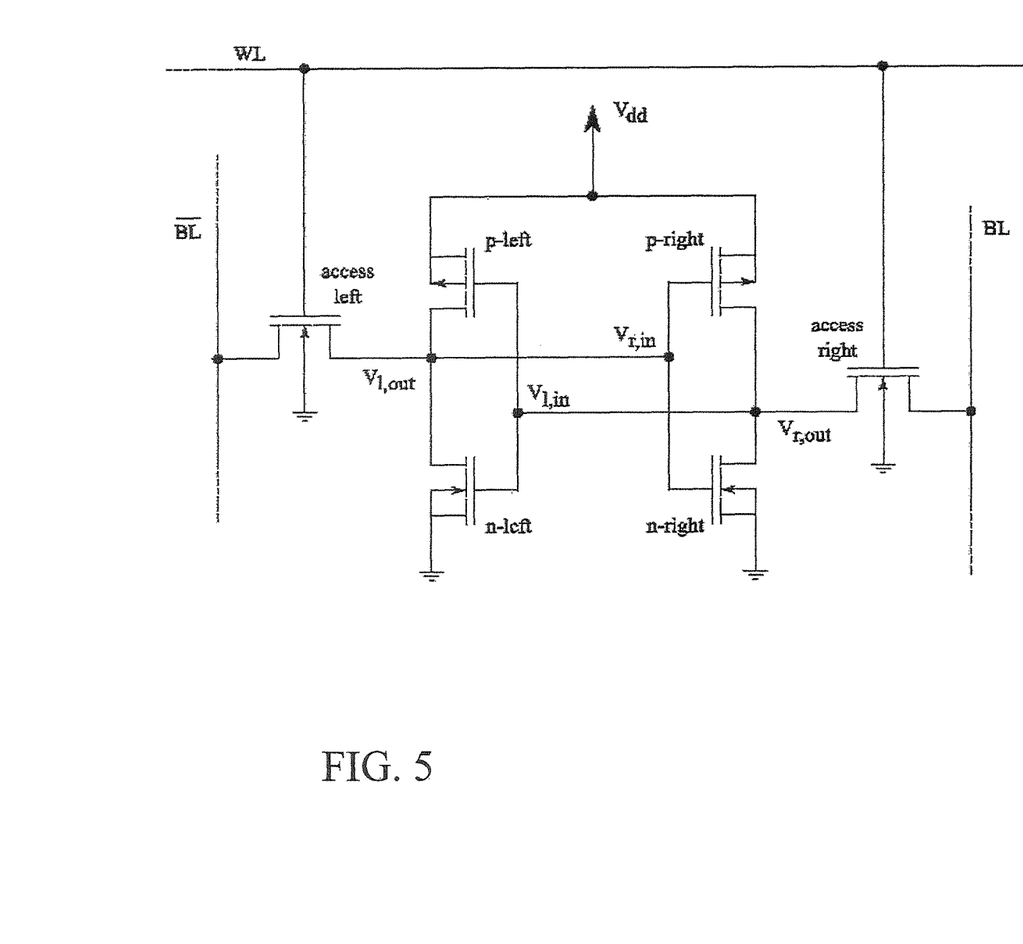
FIG. 5 shows an example of a six transistor SRAM being modeled.

Many independent random variables must be used to model the process variations, including device mismatches, for example, transistors in an SRAM (See FIG. 5). This is merely an example, as this technique can be applied to a variety of different applications.

Basically, a computer system can use uniform sampling, figure out the failures and once the computer system is aware of the central gravity of failure of the SRAM circuit or other device being modeled, then we the central gravity of failure is determined through an equation. Equation can be polynomial or other high order equation.

Explore Failure Region

Figure 1:
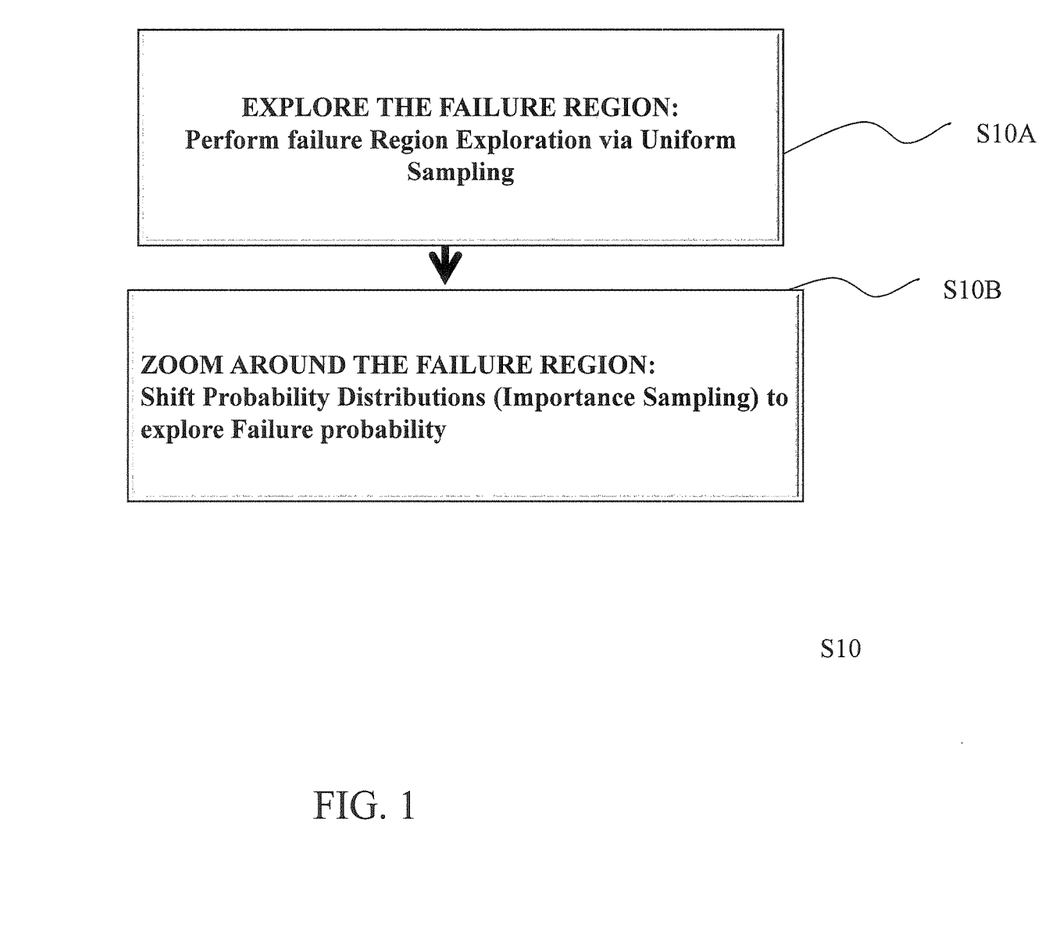
FIG. 1 shows a technique of failure analysis using an example embodiment of the invention.
Figure 2:
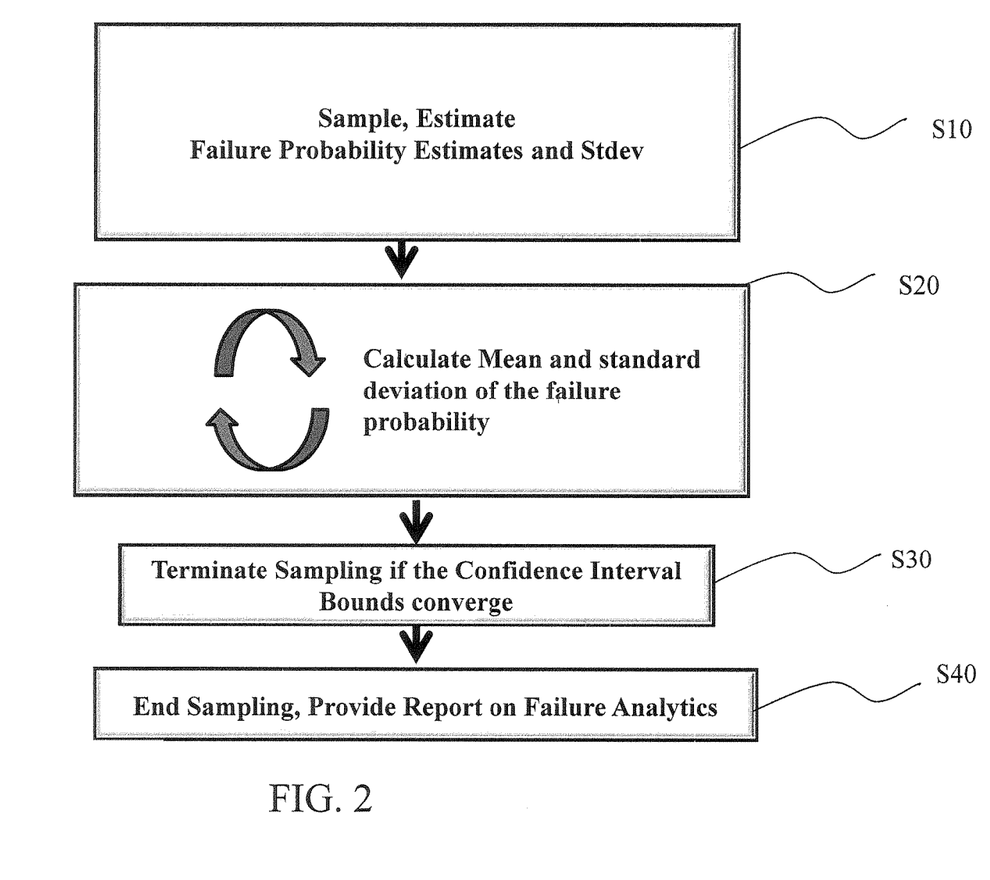
FIG. 2 shows further detail of the example of the failure analysis of FIG. 1.

Referring to FIG. 1, first the computer system finds the uniform sampling and failure region of a circuit S10A.

Referring to FIG. 5, if an SRAM which as six transistor set, the computer system uniformly treats these variables of the SRAM. These variables can be variations or mismatch. For each transistor the computer system assigns a mismatch. For example, the computer system varies that from $-6\sigma$ to $+6\sigma$ uniformly. The sigma would be the standard deviation. The computer system would take 1 sigma and $-1$ sigma and multiply with 6 for the number of transistors. Then the computer system finds out the where the SRAM is going to fail for a certain criteria.

For example, if one is looking at readability or read stability of SRAM, then if the 0 turns to be 1, then it has failed. Therefore, if while reading, the zero flips to be a 1, then it has failed while reading. If one uses that criteria that the noise on zero level exceeds 50%, then there is a failure. Similarly to writeability, one can have the condition that the circuit has to write 1 to the 0 side, but the circuit cannot even go about 50%-90% value on the 0 side. Then it will not be able to write at all.

Therefore, first uniform sampling of the variables (such as readability, writability, etc) is made. Random samples are generated and a sweep those variables are in the uniform sampling in order to explore the failure region $\Omega$ (step S10A).

Zoom Around Failure Region

Then after exploring the failure region, there is a shift of the distributions in that region and start sampling in that region in step S10B. If an analysis has a large number of samples such as 5000 samples, then the computer system could hypothetically use 1000 samples for uniform sampling and 15,000 runs. Using these two steps (S10A and S10B), the computer system is able to zero in into the tail region. However, if the number of variable increase, e.g., from 5,000 to 20,000 or 30,000 variables, then the question is whether a computer system perform 1000 runs for the first step and 1500 steps for the second step of S10B.

Convergence

The question would then be would that be enough runs to provide a result that can be duplicated. However, the computer system does not put a limit on the number of steps or runs, but instead stop at when there is a convergence.

Figure 3:
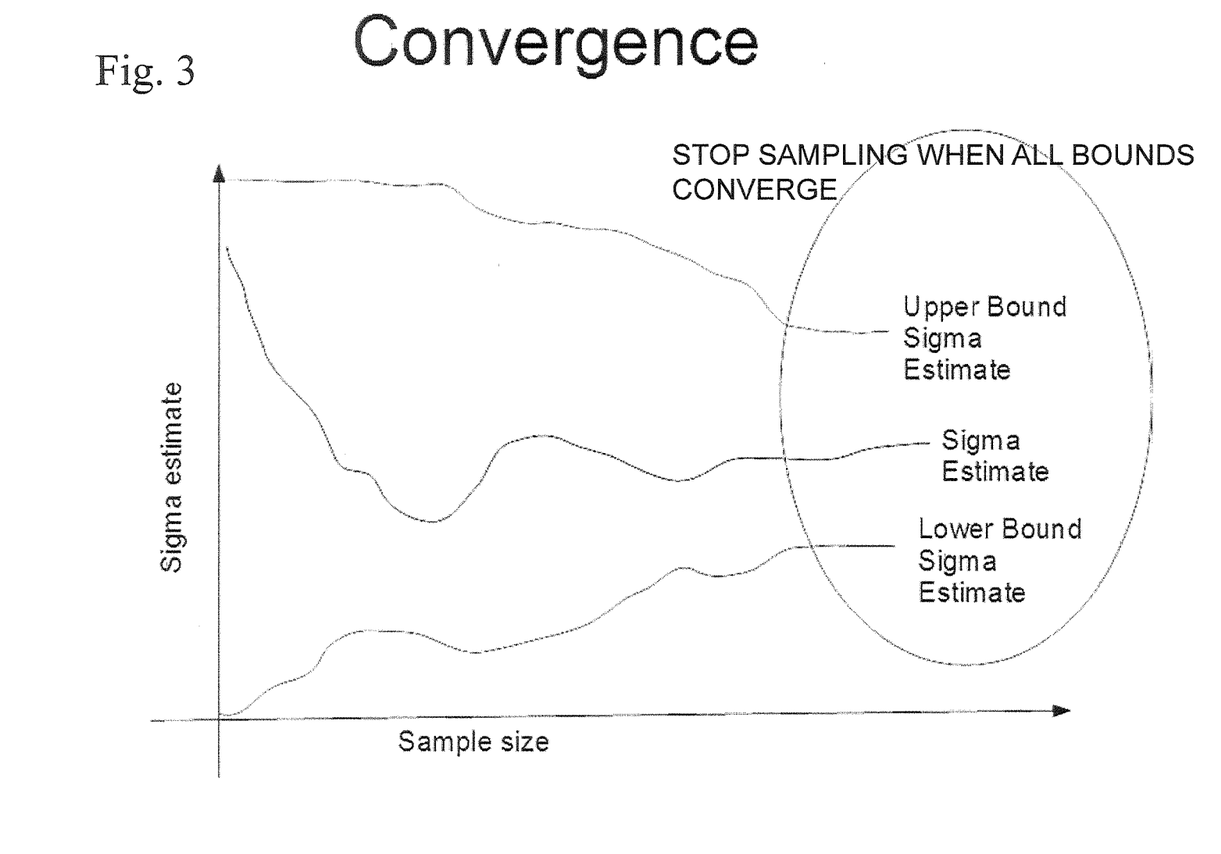
FIG. 3 shows a graph of convergence using the technique of FIGS. 1 and 2.

Referring to FIG. 3, there are three bounds that are taken into account. The first is the upper bound, the second is the sigma estimate and the third is the lower bound. The upper bound can be, for example, +6σ and the lower bound can be −6σ (for example). A sigma value σ is a description of how far a sample or point of data is away from its mean, expressed in standard deviations σ. When they all converge, then the steps are done for the zoom around the failure region Ω. Therefore, one will get the sigma a after the computer system finishes the second step S10B (FIG. 1).

For example, the following shows the convergence of 5000 samples.

| | | Large 5000-5000 samples | | | |
|---|---|---|---|---|---|
| #samples | Yield | Yield_UB | Yield_LB | | |
| 100 | 6.28522 | 6.94626 | 6.17819 | 7.99 | 6.11374 |
| 200 | 5.99896 | 6.34729 | 5.89534 | 7.99 | 5.8309 |
| 300 | 6.0191 | 6.2111 | 5.93204 | 7.99 | 5.87619 |
| 400 | 6.04291 | 6.19915 | 5.96508 | 7.99 | 5.91124 |
| 500 | 5.8299 | 5.99281 | 5.74912 | 7.99 | 5.6929 |
| 600 | 5.85675 | 6.0119 | 5.77704 | 7.99 | 5.72199 |
| 700 | 5.87079 | 6.01088 | 5.79518 | 7.99 | 5.74215 |
| 800 | 5.88483 | 6.01522 | 5.81191 | 7.99 | 5.76091 |
| 900 | 5.90375 | 6.034 | 5.83132 | 7.99 | 5.78087 |
| 2000 | 6.03192 | 6.15733 | 5.96234 | 7.99 | 5.91227 |
| 3300 | 6.09479 | 6.2041 | 6.03118 | 6.8032 | 5.9843 |
| 4000 | 6.12469 | 6.2332 | 6.06077 | 6.78719 | 6.01517 |
| 4600 | 6.14728 | 6.25357 | 6.08387 | 6.79184 | 6.03809 |
| 4700 | 6.14728 | 6.25086 | 6.08537 | 6.66429 | 6.03885 |
| 4800 | 6.14301 | 6.24139 | 6.08189 | 6.54061 | 6.03765 |
| 4900 | 6.14484 | 6.24131 | 6.0852 | 6.52574 | 6.04095 |
| 5000 | 6.14789 | 6.2442 | 6.08823 | 6.52907 | 6.04395 |

Figure 4:
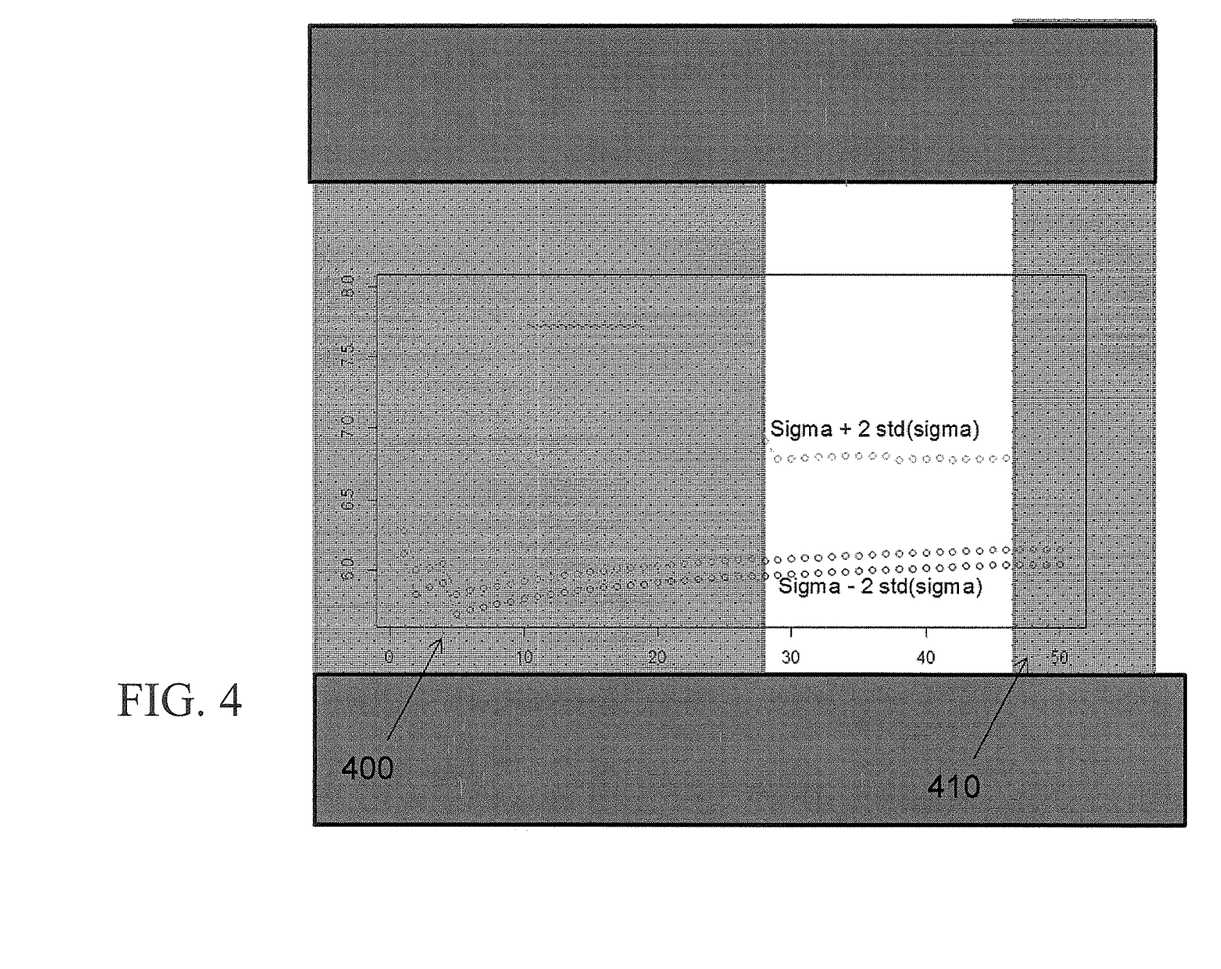
FIG. 4 illustrates a test run of the failure analysis of an example embodiment.

Referring to FIG. 4, the above 5000 samples in a test case are shown to reach convergence at the tail end.

When in an analysis one increases variables, there is a question is where to stop. A question to be resolved is whether one knows the sigma value is correct one. For example, if after 30,000 iteration the analysis provides a sigma 1, but then after 5000 iteration the system provides sigma 2. There would a problem of not having a consistent result.

The computer system calculates the mean and standard deviation of the failure probability in step S20. The sigma values are exploited. Go to a plus and minus certain sigma to provide the upper bound and lower bound, and look at from the perspective of convergence. This encounters the multidimensionality issue, when you have a large number variables and you do not know where to stop otherwise you will get changing results.

The computer system terminates sampling if the confidence interval bounds converge (Step S30) as seen in FIG. 3. The convergence can be set to be within a certain threshold. After the sampling is terminated, the computer system provides a report of the failure analytics on a peripheral device such a display device or printer or other forms of display (Step S40).

In summary, a breakthrough in run time for failure analysis with large number of dimensional variability can be made where key variables can be pruned to decrease the number of variables. The disclosed technique can be applied to large number of variables. This methodology fits into PERFECT project deliverables Overall this methodology also enhances the capability of predictive analytics.

Example Applications

As shown above, an example of an application is provided for an SRAM in FIG. 5. In other examples, failure analytics can also be performed in the healthcare, finance, manufacturing, supply, business, workforce and many other related areas where large data analytics are required fields. Therefore, the technique of the disclosed invention can be universally applied to any application where large data analytics are needed.

Figure 6:
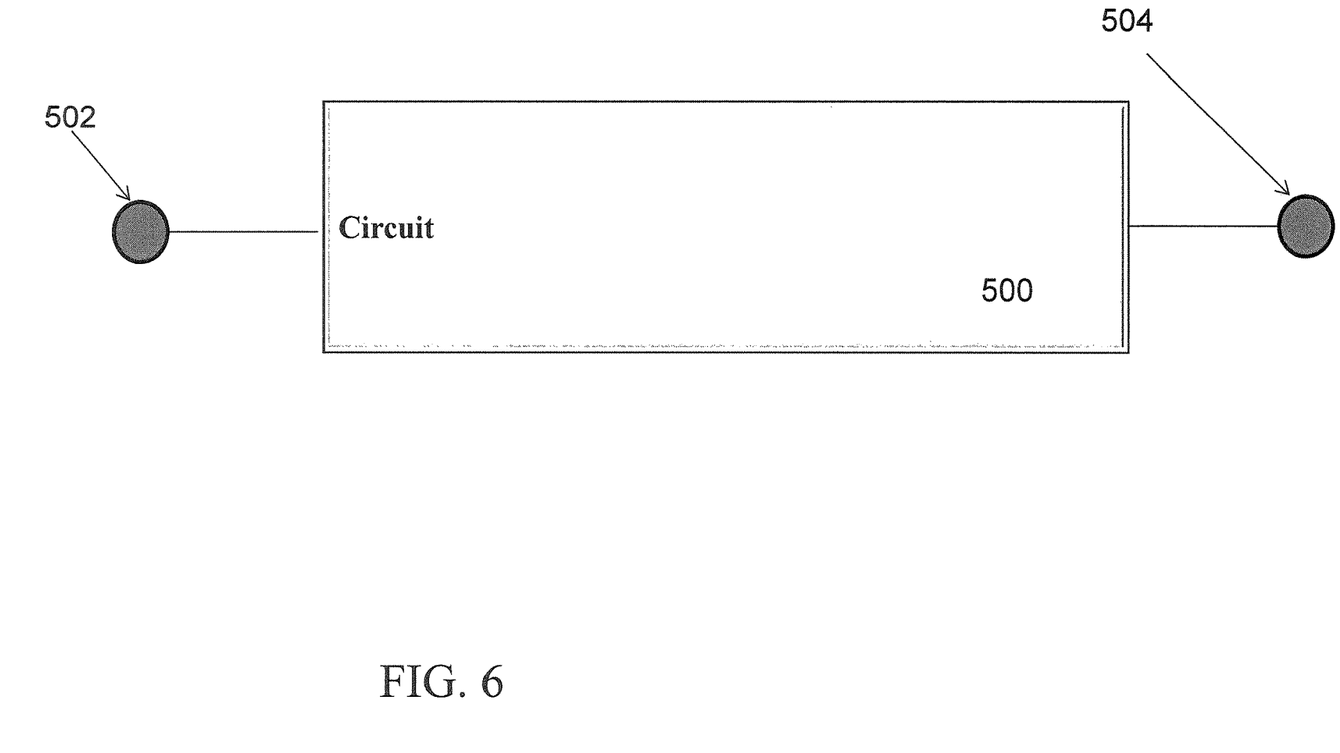
FIG. 6 illustrates another example being modeled using the technique of the claimed invention.

For example, referring to FIG. 6, a healthcare monitoring circuit 500 (or in software using a computer) includes an input 502 and an output 504. For example, in the healthcare field, a data input from a sensor that monitors certain fields such as temperature, heart rate, etc. from a patient is sent to the input terminal at 502 and a health monitoring circuit 500, e.g., temperature, heart rate monitor, etc., would analyze the input at input terminal 502 and provides the analysis or modified reading at output 504.

The healthcare monitor circuit 500 can be substituted for computer or another circuit that, for example, runs financial analysis or other applications. The healthcare monitor circuit 500 can also be substituted for a semiconductor manufacturing unit or other processing unit.

The health monitoring circuit 500 can be analyzed for failure from the input terminal 502 and output terminal 504. First, a computer system (such as computer system 600 of FIG. 7) finds the uniform sampling and failure region of the health monitor circuit 500. A first uniform sampling of the variables (such as analysis of sensed reading at output terminal 504, etc) is made from a predetermined set of inputs at input terminal 502. Random samples are generated and a sweep those variables are in the uniform sampling in order to explore the failure region Ω. Then after exploring the failure region Ω, there is a shift of the distributions in that region and start sampling in that region.

Then there are at least three bounds that are taken into account. There could be more bounds used as needed. The first is the upper bound, the second is the sigma estimate and the third is the lower bound. The upper bound can be, for example, +3σ and the lower bound can be −3σ (for example). When they all converge, then the steps are done for the zoom around the failure region Ω. Therefore, one will get the sigma σ after the computer system (See, e.g., Computer system 600 of FIG. 7) finishes the processes. Therefore, the healthcare monitoring circuit 500 (See FIG. 6) can analyzed for failure analytics using the computer 600 (See FIG. 7) using the input terminal 502 and the output terminal 504.

A similar technique can be used in finance, manufacturing, supply, business, workforce and many other related areas where large data analytics are required fields.

Exemplary Hardware Implementation

Figure 7:
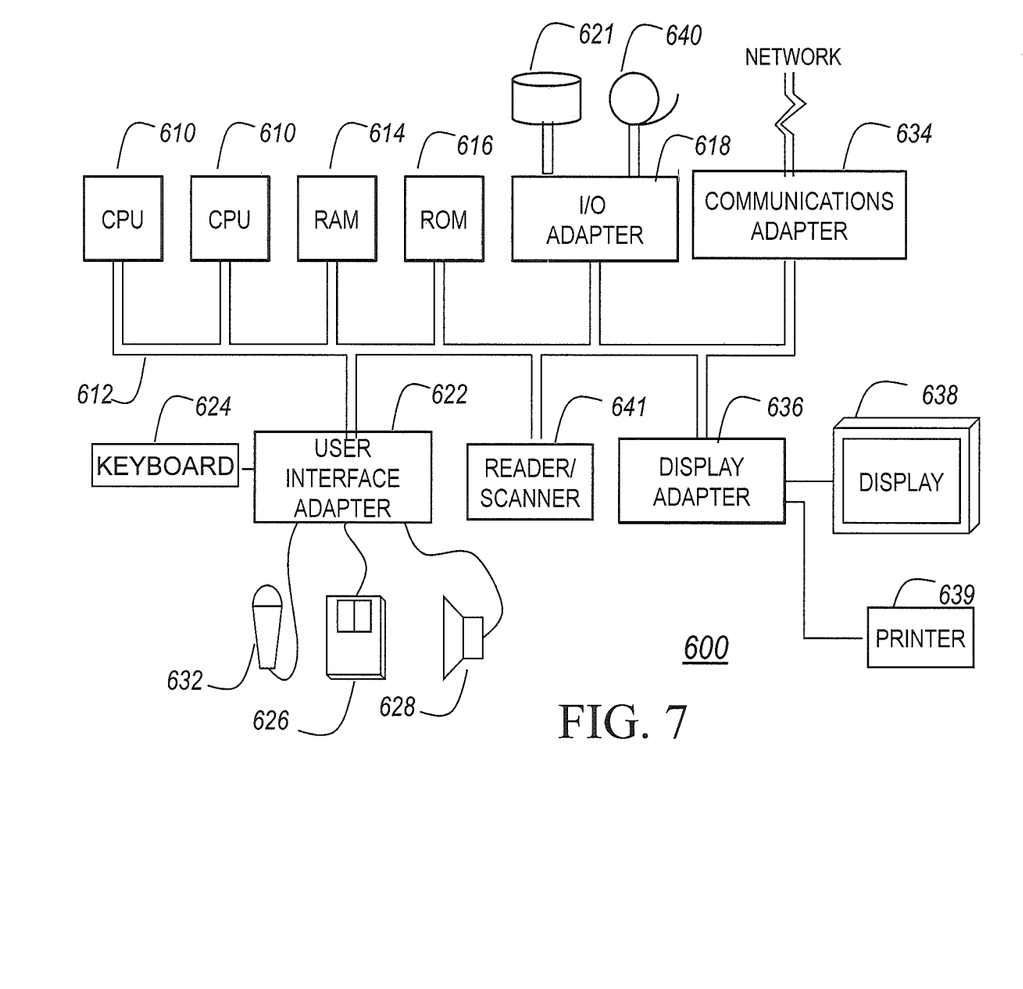
FIG. 7 illustrates an exemplary hardware/information handling system for incorporating the exemplary embodiment of the invention therein.

FIG. 7 illustrates another hardware configuration of an information handling/computer system 600 in accordance with the invention and which preferably has at least one processor or central processing unit (CPU) 610 that can implement the techniques of the invention in a form of a software program.

The CPUs 610 are interconnected via a system bus 612 to a random access memory (RAM) 614, read-only memory (ROM) 616, input/output (I/O) adapter 618 (for connecting peripheral devices such as disk units 621 and tape drives 640 to the bus 612), user interface adapter 622 (for connecting a keyboard 624, mouse 626, speaker 628, microphone 632, and/or other user interface device to the bus 612), a communication adapter 634 for connecting an information handling system to a data processing network, the Internet, an Intranet, a personal area network (PAN), etc., and a display adapter 636 for connecting the bus 612 to a display device 638 and/or printer 639 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing storage media tangibly embodying a program of machine-readable instructions executable by a digital data processor incorporating the CPU 610 and hardware above, to perform the method of the invention.

This signal-bearing storage media may include, for example, a RAM contained within the CPU 610, as represented by the fast-access storage for example.

Alternatively, the instructions may be contained in another signal-bearing storage media 700, such as a magnetic data storage diskette 710 or optical storage diskette 720 (FIG. 8), directly or indirectly accessible by the CPU 610.

Figure 8:
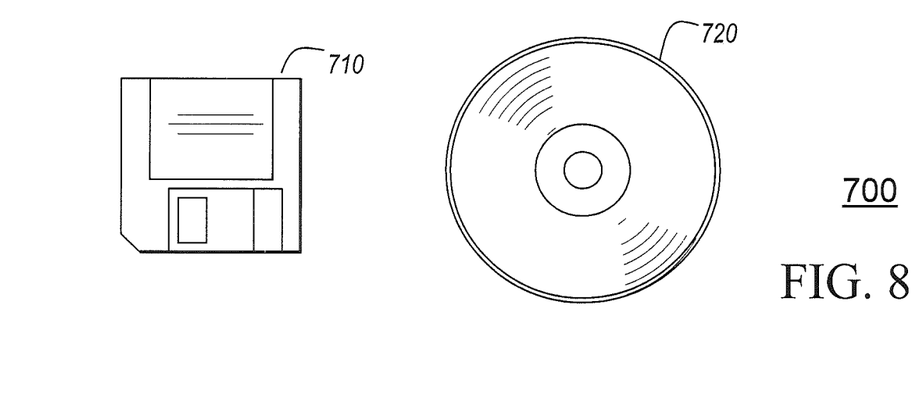
FIG. 8 illustrates a signal-bearing storage medium for storing machine-readable instructions of a program that implements the method according to the exemplary embodiment of the invention.

Whether contained in the diskette 710, the optical disk 720, the computer/CPU 610, or elsewhere, the instructions may be stored on a variety of machine-readable data storage media.

Therefore, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A computer system executing a method stored in a computer readable medium, comprising:
    a processor performing a failure region exploration through uniform sampling of plurality of variables related to a circuit;
    the processor estimating a failure probability and standard deviation by determining mean and standard deviation of failure probability of a circuit;
    the processor terminating sampling when a confidence interval bounds converge; and
    a peripheral device providing a report on the failure of the circuit when the sampling is terminated by the processor.

2. The computer system according to claim 1, wherein the confidence interval bounds include an upper bound sigma estimate, a lower bound sigma estimate, and sigma estimate, and
    wherein the processor stops sampling when the upper bound sigma estimate, the lower bound sigma estimate, and the sigma estimate substantially converge.

3. The computer system according to claim 2, wherein the processor stops sampling when the upper bound sigma estimate, the lower bound sigma estimate, and the sigma estimate converge by a predetermined threshold and before divergence of the upper bound sigma estimate, the lower bound sigma estimate, and the sigma estimate.

4. The computer system according to claim 1, wherein the confidence interval bounds include an upper bound sigma estimate, a lower bound sigma estimate, and sigma estimate, and
    wherein the processor stops sampling when the upper bound sigma estimate, the lower bound sigma estimate, and the sigma estimate substantially converge by a predetermined threshold.

5. The computer system according to claim 1, wherein the variance of the probability of the failure is calculated based on the sample weights of an applied mixed importance sampling.

6. The computer system according to claim 1, further comprising the processor shifting probability distributions from the failure region exploration to explore failure probability,
    wherein the probability of failure and the statistical variance are evaluated incrementally for each variable.

7. The computer system according to claim 1, wherein the processor prunes the number of variables through with known statistical variations based on the probability of failure and statistical variance calculated within a simulation of the circuit.

8. A system for computing and modeling the probability of a failure of a circuit, comprising:
    a processor measuring a system functionality by an indicator function based on one or more output variables and pre-given. thresholds stored in a computer readable medium;
    the processor simulating a system behavior for a sequence of samples of random model parameters; and
    the processor determining the probability of failure and the statistical variance of that are being evaluated at each sampling stage.

9. The system according to claim 8, further comprising the processor terminating a sequence of the simulations when the said statistical variance is below a predetermined target, and a rate of change of the variance is below a threshold designed as a stopping criterion,
    wherein the system exhibits inherent variability with a multitude of model parameters under prescribed statistical variability.

10. The system according to claim 8, wherein the termination of the sequence of simulation when convergence is made between an upper bound, lower bound and a sigma estimate.

11. The system according to claim 8, further comprising the processor pruning key variables which are input for the plurality of simulations.

12. The system according to claim 8, wherein the processor determines an upper bound sigma estimate, a lower bound sigma estimate, and sigma estimate, and
    wherein the processor stops sampling when the upper bound sigma estimate, the lower bound sigma estimate, and the sigma estimate substantially converge by the predetermined threshold.

13. The system according to claim 12, wherein the processor stops sampling when the upper bound sigma estimate, the lower bound sigma estimate, and the sigma estimate converge by a predetermined threshold and before divergence of the upper bound sigma estimate, the lower bound sigma estimate, and the sigma estimate.

14. The system according to claim 8, wherein the variance of the probability of the failure is calculated based on the sample weights of an applied mixed importance sampling.

15. The system according to claim 1, wherein the probability of failure and the statistical variance are evaluated incrementally for each variable.

16. The system according to claim 1, wherein the processor prunes the number of variables through with known statistical variations based on the probability of failure and statistical variance calculated within the simulations of the circuit.

17. A method computing and modeling the probability of a failure of a device, the method comprising:
  performing a failure region exploration through uniform sampling of plurality of variables related to the device;
  estimating a failure probability and standard deviation by determining mean and standard deviation of failure probability of a device;
  terminating sampling when a confidence interval bounds converge; and
  providing a report on the failure of the circuit when the sampling is terminated.

18. The method according to claim 17, further comprising the shifting probability distributions from the failure region exploration to explore failure probability,
  wherein the confidence interval bounds include an upper bound sigma estimate, a lower bound sigma estimate, and sigma estimate, and
  wherein a processor stops sampling when the upper bound sigma estimate, the lower bound sigma estimate, and the sigma estimate substantially converge.

19. The method according to claim 18, wherein the processor stops sampling when the upper bound sigma estimate, the lower bound sigma estimate, and the sigma estimate converge by a predetermined threshold and before divergence of the upper bound sigma estimate, the lower bound sigma estimate, and the sigma estimate.

20. The method according to claim 17, wherein the confidence interval bounds include an upper bound sigma estimate, a lower bound sigma estimate, and sigma estimate, and
  wherein a processor stops sampling when the upper bound sigma estimate, the lower bound sigma estimate, and the sigma estimate substantially converge by a predetermined threshold.

* * * * *